US007039881B2

(12) United States Patent
Regan

(10) Patent No.: US 7,039,881 B2
(45) Date of Patent: May 2, 2006

(54) MODIFICATION OF INTEGRATED CIRCUITS

(76) Inventor: Timothy James Regan, 6 Coneygere, Olney, Bukinghamshire MK46 4AF (GB)

( * ) Notice: Subject to any disclaimer, the term of this patent is extended or adjusted under 35 U.S.C. 154(b) by 0 days.

(21) Appl. No.: 10/148,527

(22) PCT Filed: Dec. 8, 2000

(86) PCT No.: PCT/GB00/04712

§ 371 (c)(1),
(2), (4) Date: Oct. 9, 2002

(87) PCT Pub. No.: WO01/42994

PCT Pub. Date: Jun. 14, 2001

(65) Prior Publication Data

US 2003/0084418 A1 May 1, 2003

(30) Foreign Application Priority Data

Dec. 8, 1999 (GB) ................................. 9929084.3

(51) Int. Cl.
*G06F 17/50* (2006.01)
(52) U.S. Cl. ............................................. 716/3; 716/2
(58) Field of Classification Search ................ 716/2–3
See application file for complete search history.

(56) References Cited

U.S. PATENT DOCUMENTS

| | | | |
|---|---|---|---|
| 4,703,435 A * | 10/1987 | Darringer et al. | 716/18 |
| 5,018,074 A | 5/1991 | Griffith et al. | |
| 5,438,524 A * | 8/1995 | Komoda | 716/18 |
| 5,682,320 A * | 10/1997 | Khouja et al. | 716/4 |
| 5,751,596 A * | 5/1998 | Ginetti et al. | 716/6 |
| 5,822,214 A * | 10/1998 | Rostoker et al. | 716/10 |
| 5,867,395 A * | 2/1999 | Watkins et al. | 716/18 |
| 5,936,868 A * | 8/1999 | Hall | 716/4 |
| 5,987,086 A * | 11/1999 | Raman et al. | 716/1 |
| 6,446,239 B1 * | 9/2002 | Markosian et al. | 716/2 |

FOREIGN PATENT DOCUMENTS

EP 0 742 527 A 11/1996

OTHER PUBLICATIONS

Nakamura et al, "Lores-Logic Reorganization System", Proceedings of the Fifteenth Design Automation Conference, Las Vegas, NV, 1978, pp. 250-260.*
"Migratable Library Generation", *IBM Technical Disclosure Bulletin*, IBM Corp., New York, US, vol. 40, No. 1, Jan. 1997, pp. 229-230, XP000686159, ISSN: 0018-8689, the whole document.
Copy of PCT International Search Report for PCT/GB 00/04712, dated Mar. 21 2002.

* cited by examiner

Primary Examiner—Vuthe Siek
Assistant Examiner—Brandon Bowers
(74) Attorney, Agent, or Firm—Fay, Sharpe, Fagan, Minnich & McKee, LLP

(57) ABSTRACT

A process for modifying the design of integrated circuits includes the steps of mapping cells of an old circuit against a library of new cells (134) and replacing at least some of the old cells with new cells having the same logical function as the old cells (156), while maintaining the electrical connections between those cells. The geometry of the electrical connections between the cells is then re-routed (168).

19 Claims, 19 Drawing Sheets

Fig. 1
Circuit hierarchy
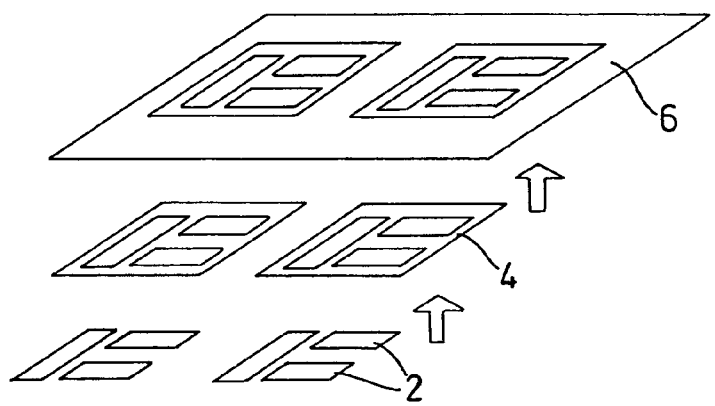
Building blocks of a circuit are placed in to larger blocks which can be placed again in to yet larger blocks.
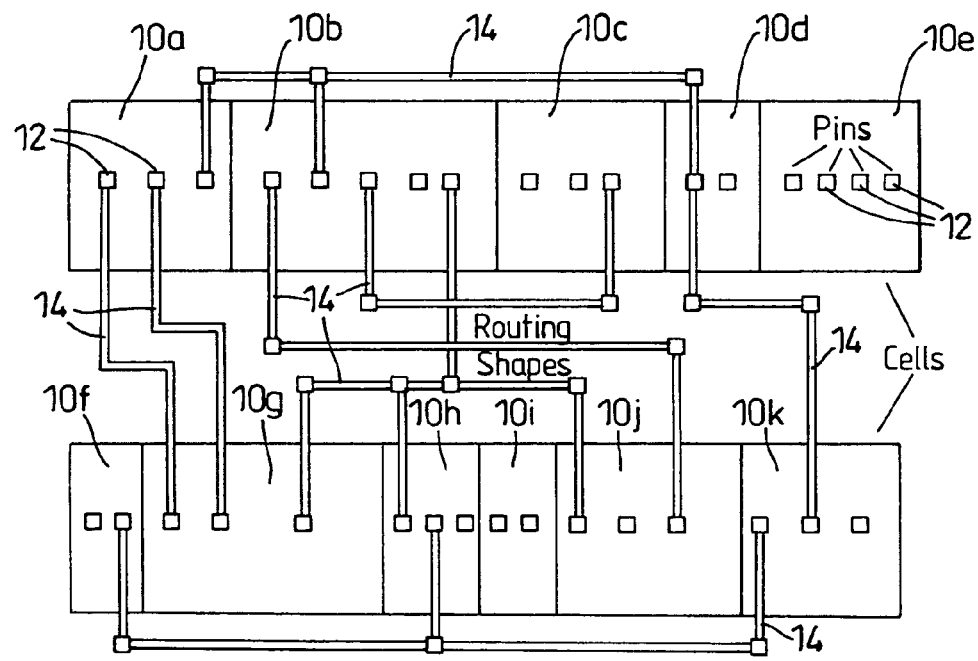
Routing geometries connecting the pins of circuit cells.
Fig. 2

| | | |
|---|---|---|
| cell: | INVX1 | INV_1 |
| pins: | A | IN |
| | Q | OUT |
| | | |
| cell: | NAND3X1 | 3NAND_1 |
| pins: | A | IN1 |
| | B | IN2 |
| | C | IN3 |
| | Q | OUT |
| permute: | (A B C) | |
| | | |
| cell: | MEMORY | DRAM32 |
| pins: | WRB[0-31] | OUTPUT[0-31] |
| | CLK | CLK |
| | REB[0-31] | INPUT[0-31] |

Example of table containing cell and pin swapping information

X dimension ratio: 0.75
Y dimension ratio: 0.93

Ratio of old cell dimensions to new cell dimensions

Scaling data in one plane of a standard cell design

General scaling of cells

New dimensions = Old dimensions * Scaling factor

Scaled shapes

New dimensions = Old dimensions * Scaling factor

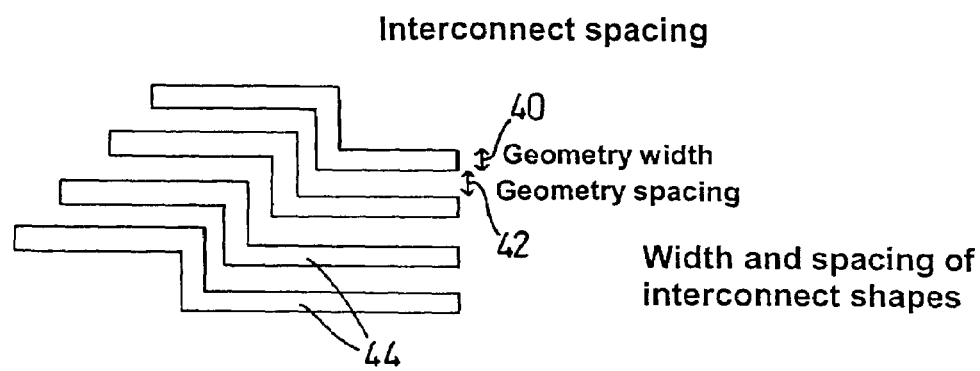
Fig. 9
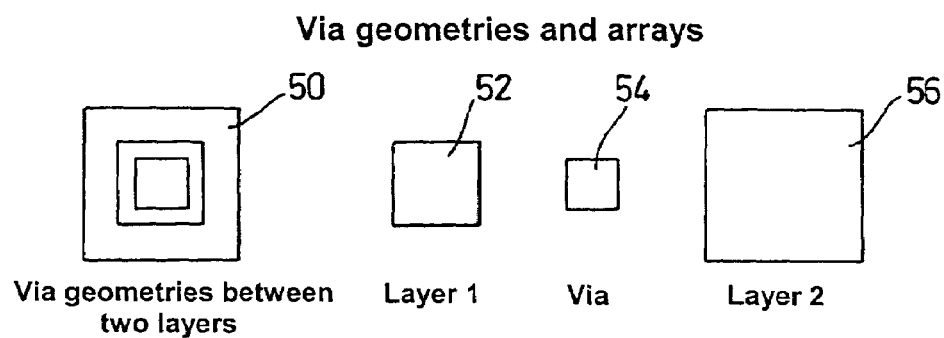
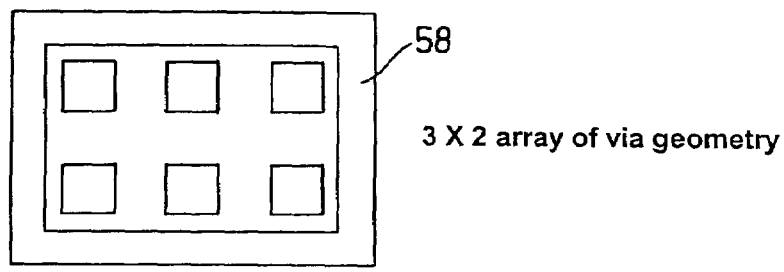
Fig. 10

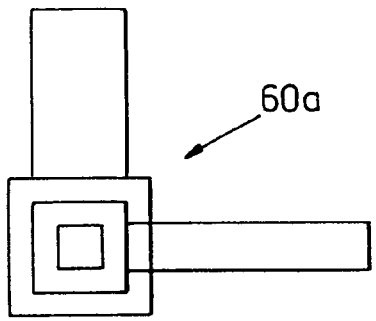
Via geometries placed as a cell
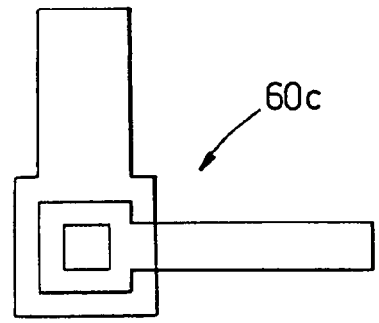
Via geometries made up from polygons
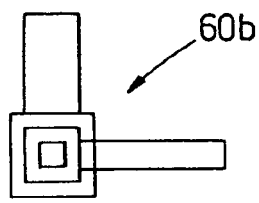
Old via cell replaced with a new instance
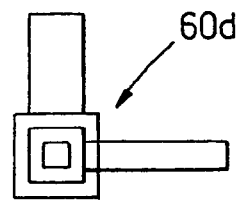
Old via polygons replaced with a new via instance
Old via Cell
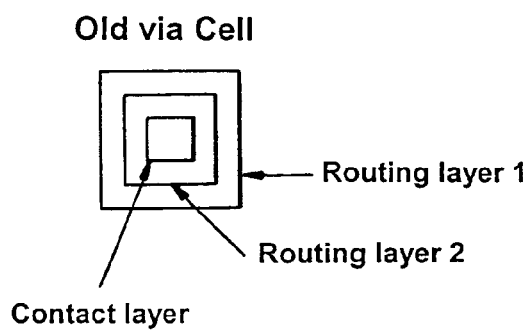
— Routing layer 1
Routing layer 2
Contact layer
New via cell
Replacing via cells in the layout
*Fig. 11*

Feedthrough points in a typical standard cell

A typical feedthrough cell

Fig. 14a  Cell swapping in a layout
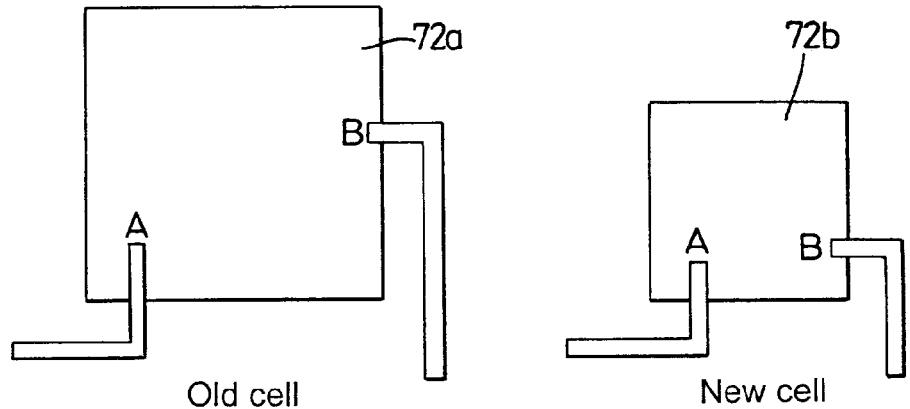
The new cell replaces the old and the routing to the connections
A & B is updated to new positions
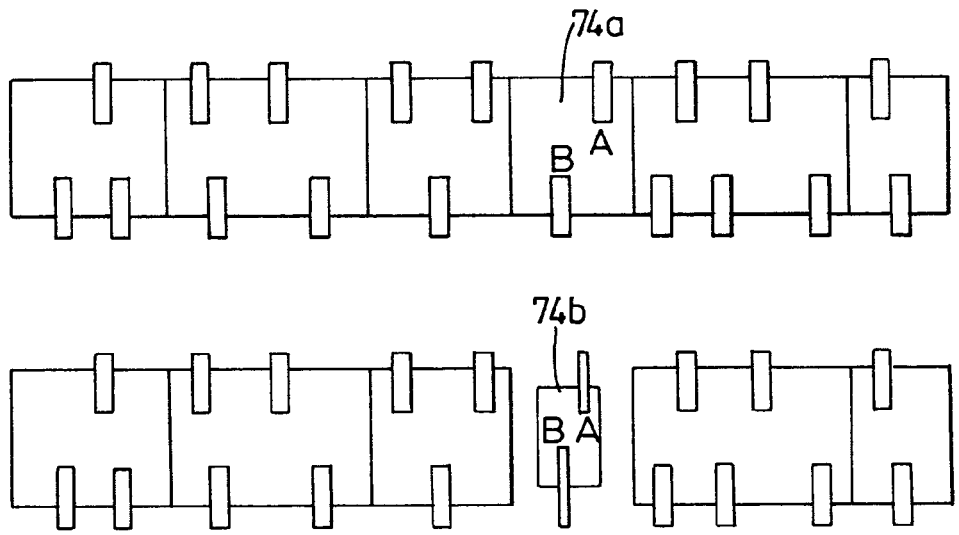
Data can be updated for individual cells, by cell type
or for all cells. The routing is updated for each cell modified
Fig. 14b

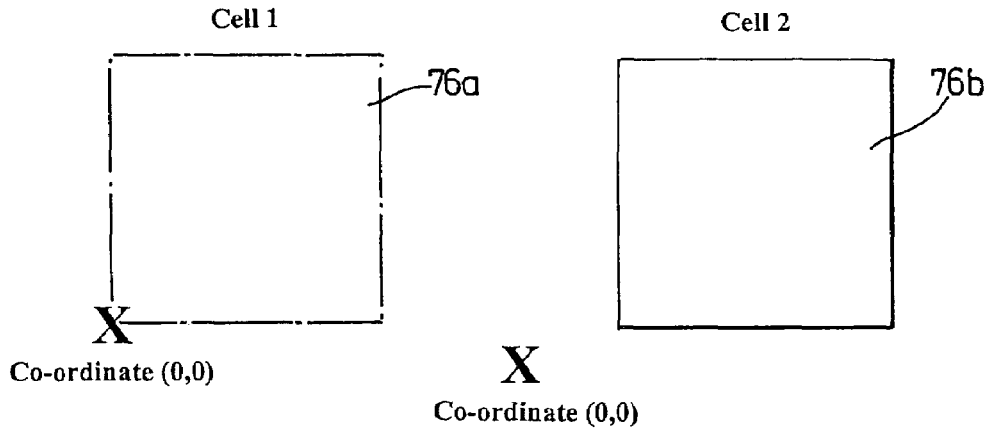
The shapes and boundary of cell2 are offset from the cell's origin of (0,0)
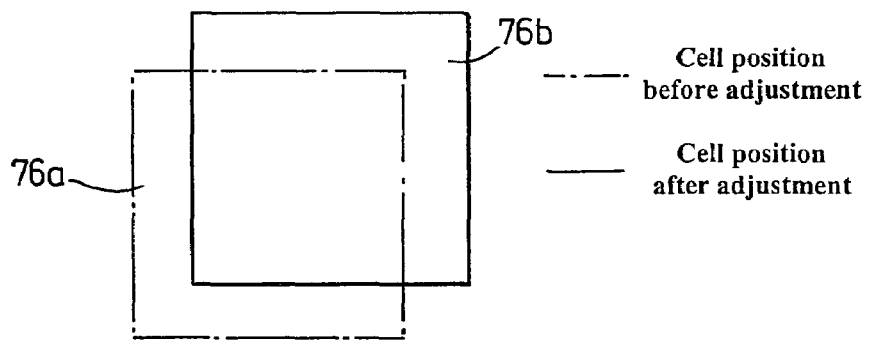
— · — Cell position before adjustment
——— Cell position after adjustment
The cell is moved by altering its co-ordinates.
co-ordinate X = co-ordinate X + delta(cell1X cell2X)
co-ordinate Y = co-ordinate Y + delta(cell1Y cell2Y)
Swapping a cell and adjusting its position
*Fig. 15*

*Fig. 16* "Rats' nest" lines showing the new connections between routing shapes and pins for a newly swapped cell Old circuit uses "nand" gate and 'inverter' from the old process library.
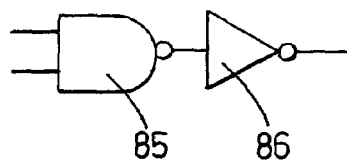
New circuit uses single 'and' component giving the identical logical function
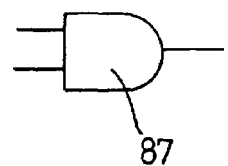
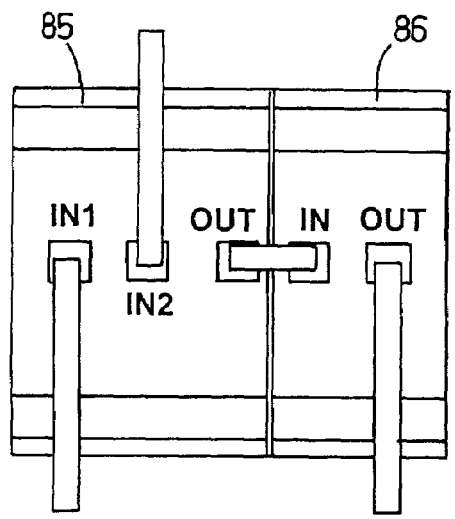
Single component replaces original gates and the routing shapes are updated accordingly
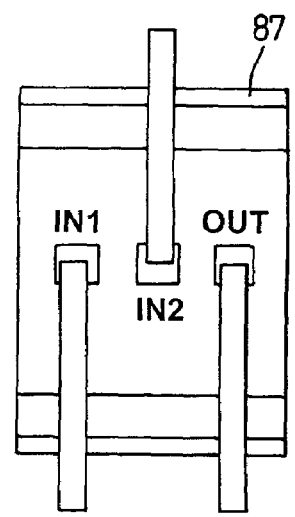
Many to one cell swapping
*Fig. 17*

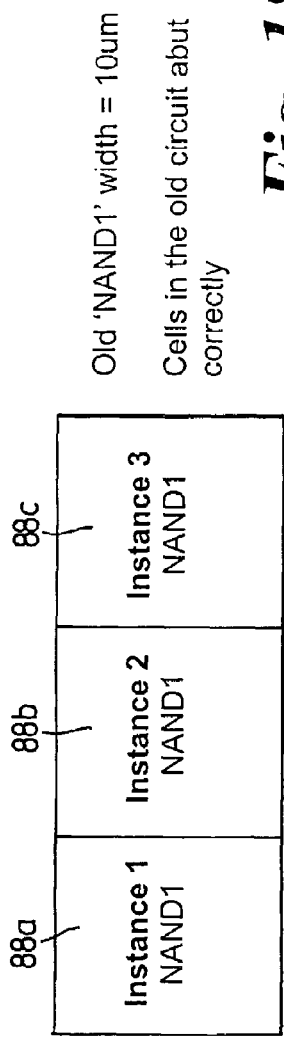
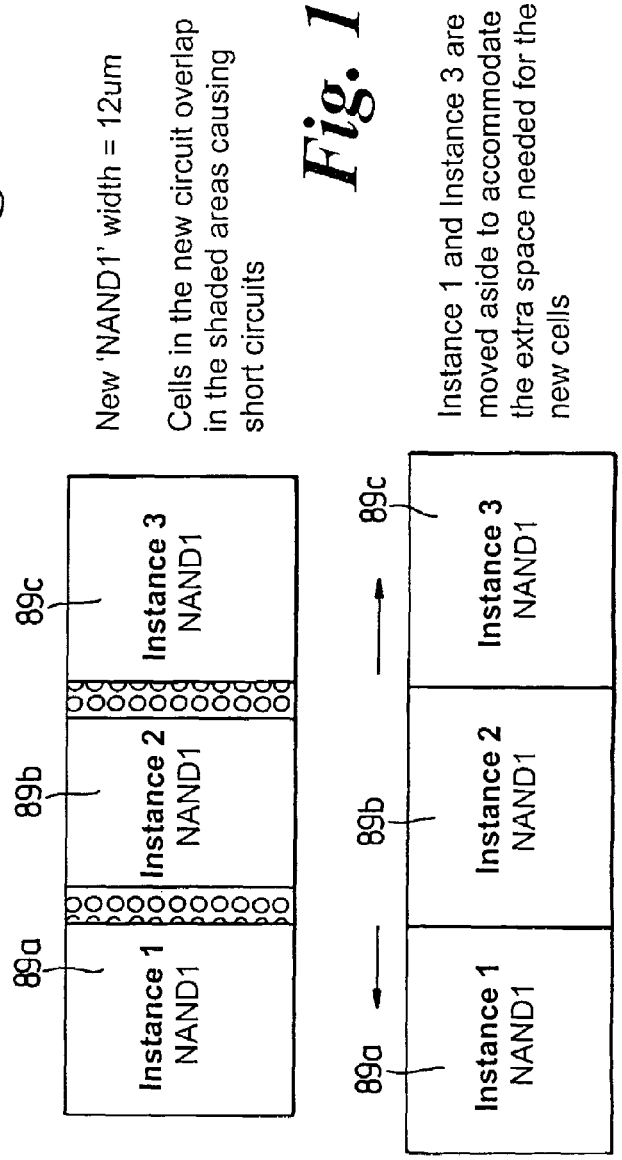
Fig. 18a — Old 'NAND1' width = 10um. Cells in the old circuit about correctly
Fig. 18b — New 'NAND1' width = 12um. Cells in the new circuit overlap in the shaded areas causing short circuits
Fig. 18c — Instance 1 and Instance 3 are moved aside to accommodate the extra space needed for the new cells
New cells moved aside to remove overlaps

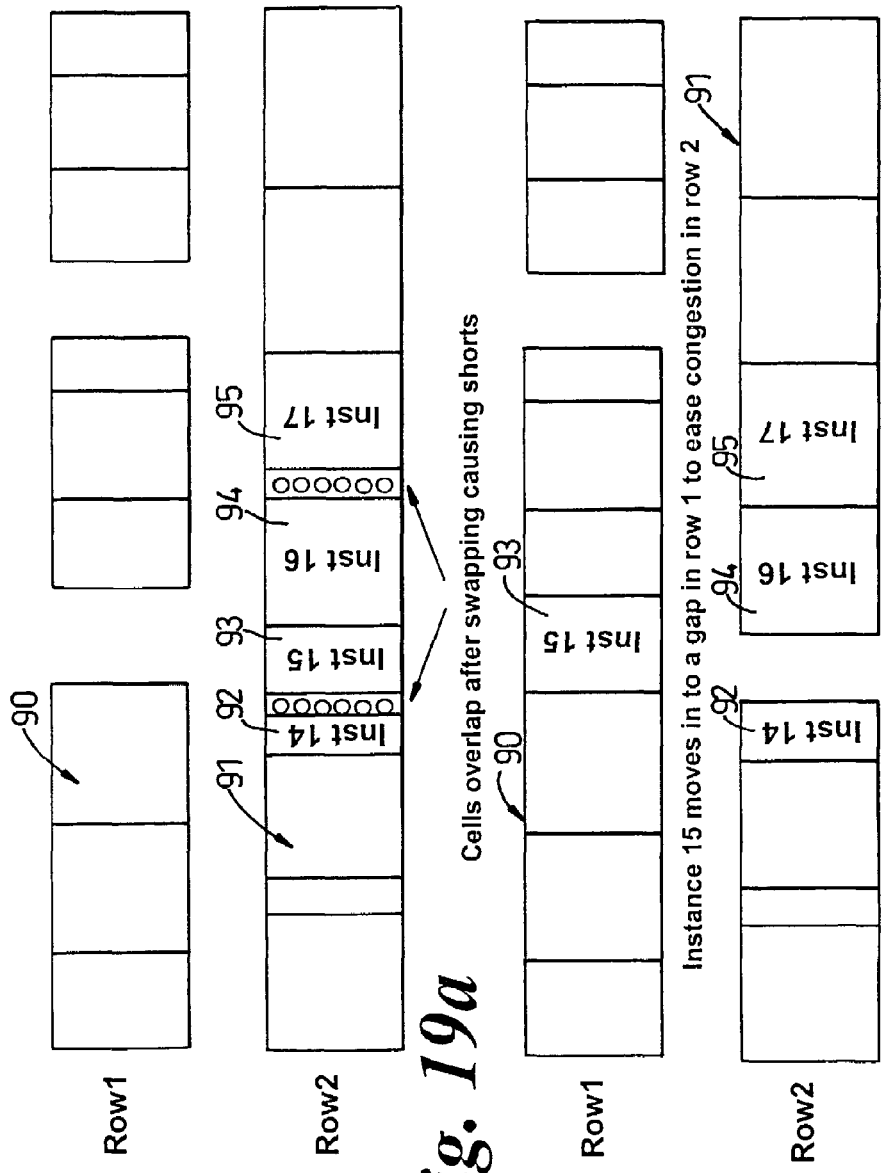
Fig. 19a — Cells overlap after swapping causing shorts
Fig. 19b — Moving cells to a different row to ease congestion
Instance 15 moves in to a gap in row 1 to ease congestion in row 2
Instances 14 and 16 are moved to prevent short circuits

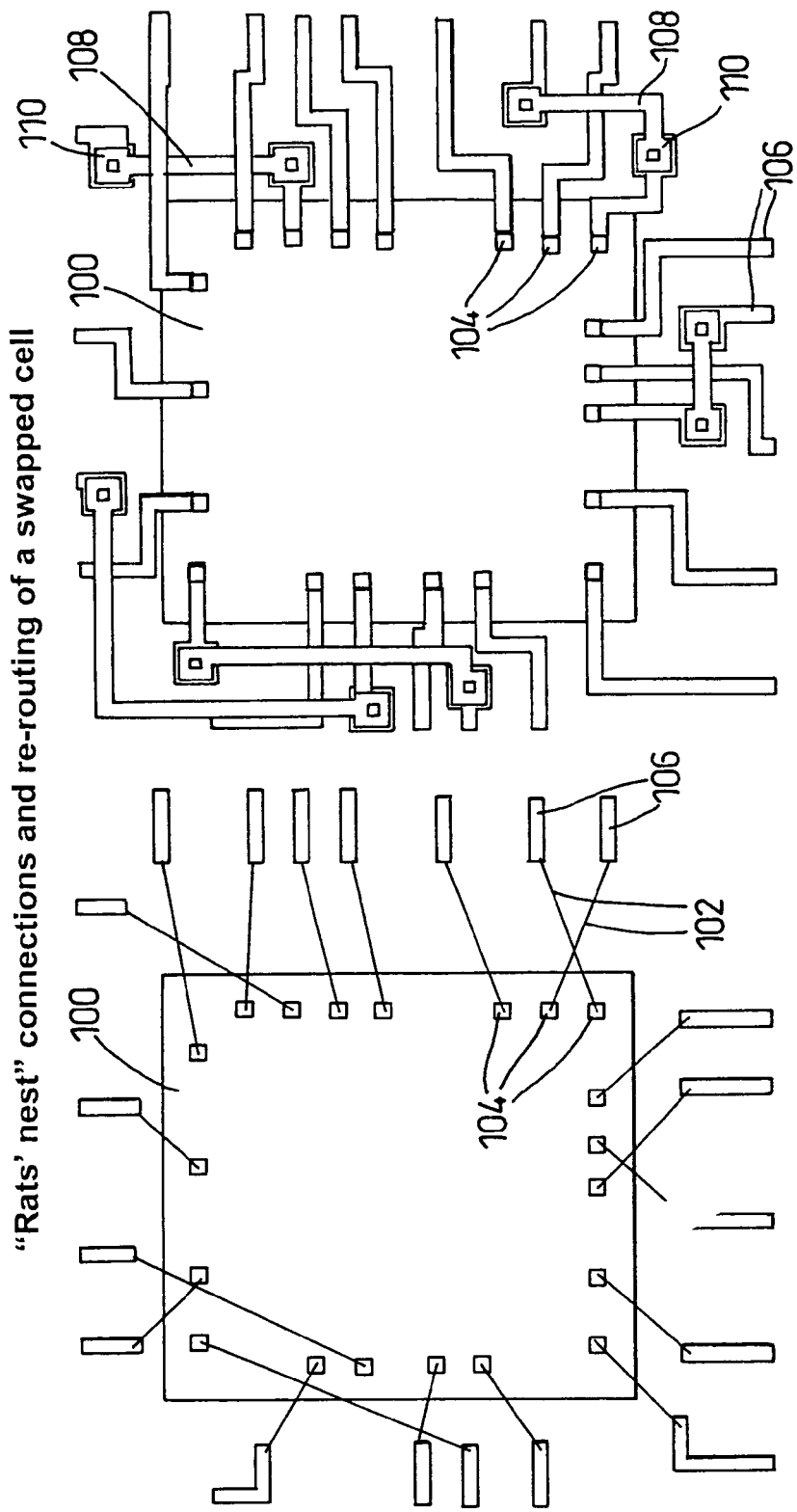

Fig. 21a
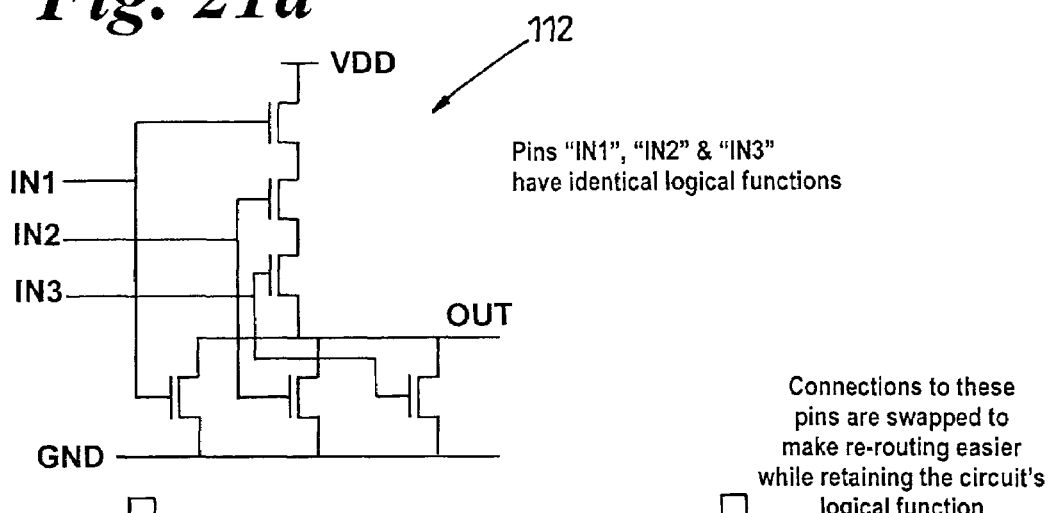
Pins "IN1", "IN2" & "IN3" have identical logical functions
Connections to these pins are swapped to make re-routing easier while retaining the circuit's logical function
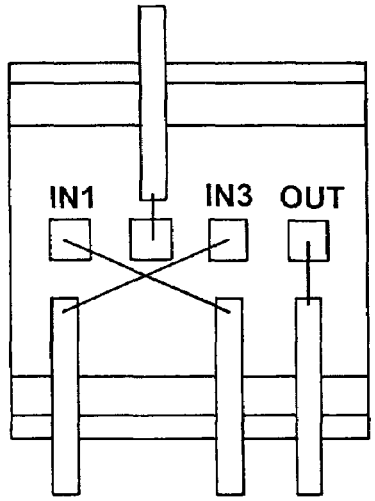
The swapped cell needs to cross the wires to pins "IN1" and "IN3"
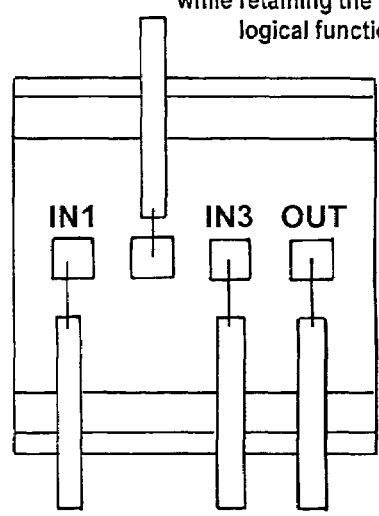
Fig. 21b          Fig. 21c
Equivalent pin swapping for a three input nand gate

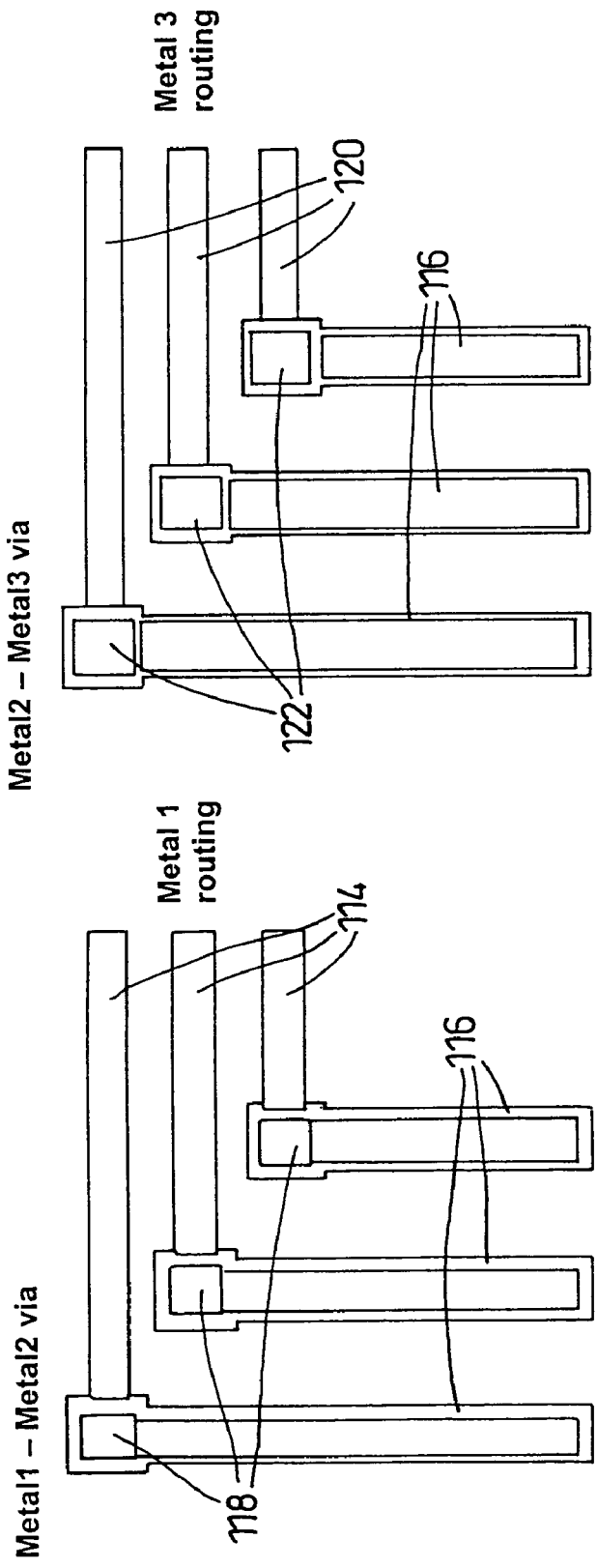

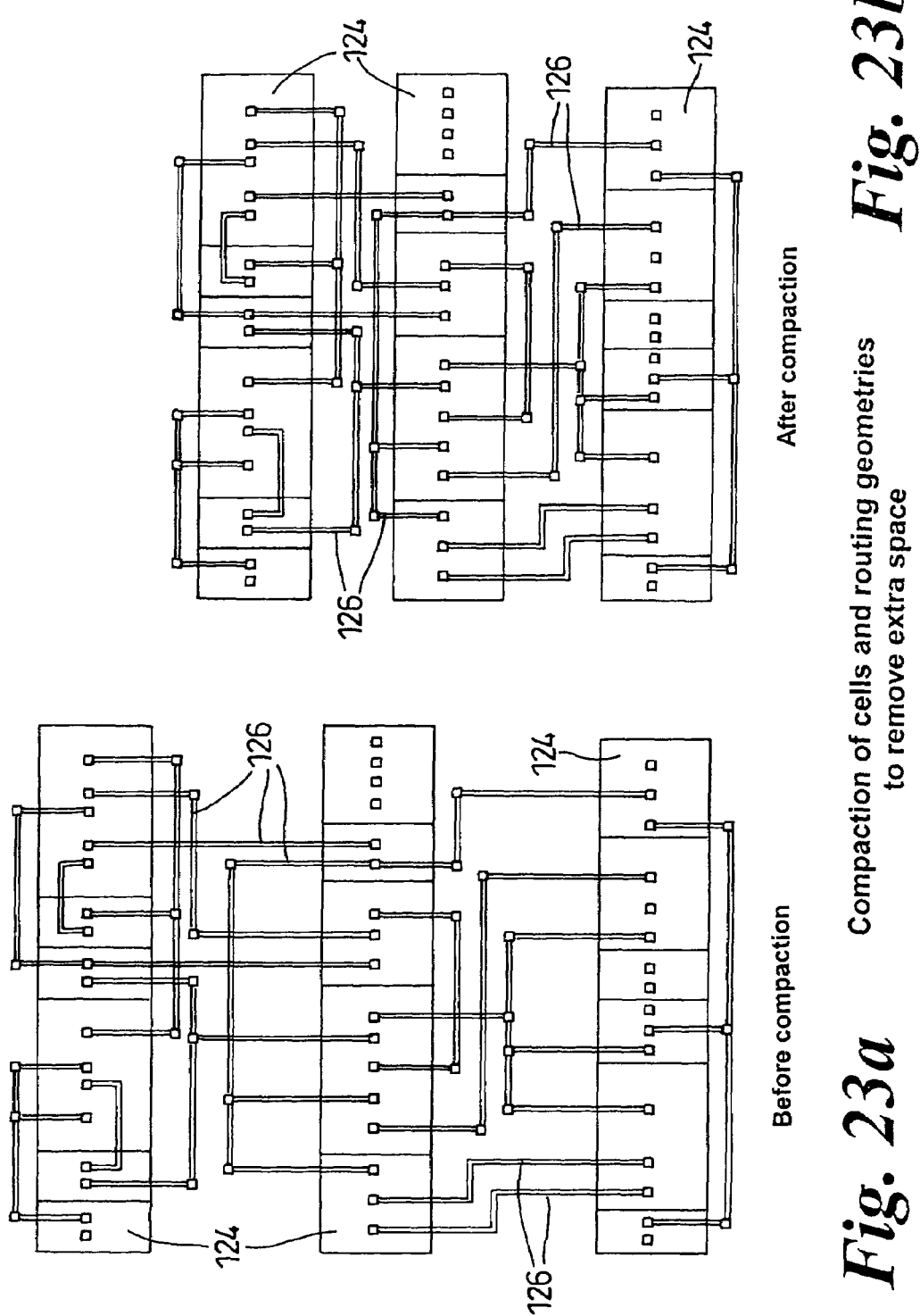
Fig. 23a  Before compaction
Fig. 23b  After compaction
Compaction of cells and routing geometries to remove extra space

MODIFICATION OF INTEGRATED CIRCUITS

The present invention relates to a process by which the physical design or "layout" of an integrated circuit may be modified to use new "cells" containing similar circuit functionality while retaining or modifying the connections between these cells.

A cell is defined as a component within the circuit design that performs a defined electrical function. Cells will typically contain a number of transistors and interconnecting wires and each cell will be replicated many times within the overall design. This level of abstraction is sometimes described as "gate level" and "macro cell" design.

More particularly, this method of "process migration" involves altering the placement and modifying the physical geometric data to accommodate new cells and swapping in the new cells for the old existing cells before making adjustments to the geometries that connect these cells. In this way, the existing physical design or "layout" of an integrated circuit can be modified to use new cells designed to a different manufacturing process while maintaining the functionality, topology and hierarchy of the original device.

This process migration technique may be described as "cell swapping" and is applicable to a computer model of the physical design or layout of any existing integrated circuit made up of sub-cells connected by routing geometries. By using this technique, the layout of a chip may be modified to be manufactured in a new process and at any scale that meets the new design rules. The method is applicable to the physical design of circuits containing the hierarchical placement of cells within other cells which together form the full design of the integrated circuit as an entire chip or circuit block (often referred to as "hard intellectual property" or "hard IP").

According to the present invention, there is provided a process for modifying the design of integrated circuits, said process including the steps of mapping electrical components of an old circuit against a library of new components, replacing at least some of the old components with new components having the same logical function as the old components while maintaining the electrical connections between those components, and subsequently adjusting the routing geometry of the electrical connections.

The process may include the use of a library of new components, obtained from a manufacturer or other third party or developed from the original library data. Advantageously, the library contains information about the each of the new components, including at least one of: the physical shapes making up the component, a description used for manufacturing, a functional electrical description, a logical description and delay information.

The process may include analysing and comparing the function and timing of the old components and the new components, and selecting the new components used to replace to old components on the basis of that comparison.

The process may include scaling the circuit by a general scaling factor. This scaling process may include comparing the relative sizes of the old components and the new components and selecting the general scaling factor on the basis of that comparison.

The process may include scaling portions of the circuit by different scaling factors, and advantageously includes applying different scaling factors in the directions of two orthogonal axes.

The process may include replacing old circuit components with new components with similar or improved functionality.

The process may include adding feedthrough cells to fills gaps left after replacing components.

The process may include replacing the via cells and/or adding feedthrough points.

The process may include adjusting the positions of the electrical components.

The process may include adding or removing routing layers.

The process may include moving electrical connections from one routing layer to another.

The process may include compacting the circuit.

The process may include verifying the circuit for both layout and timing violations.

According to a preferred embodiment of the present invention, there is provided a method of modifying integrated circuits which comprises the steps of modifying individual cells of the layout of the integrated circuit while maintaining connectivity between the modified cells, and subsequently modifying the routing geometry of said connections.

The method may comprise an initial step of determining a general scaling factor between unmodified and modified cells and an overall circuit layout.

The connections between the modified cells may be maintained by connecting a wire between the unmodified connection point and the modified connection point.

At least part of the routing geometry may be promoted to a higher interconnect layer.

The position of the modified cell may match that vacated be the unmodified cell.

The position of the modified cell may be adjusted with respect to the position of the unmodified cell.

Additional cells, such as feedthrough cells, may be introduced during the modifying step.

During the step of modifying the routing geometries, any via cells may be so moved as to continue to be functional in connecting routing layers.

According to a second aspect of the present invention, there is provided a method of modifying integrated circuits which comprises the steps of modifying individual cells of the layout of the integrated circuit, in which the scaling factor along one axis is determined independently of the scaling factor along the orthogonal axis. In this case, where the two scaling factors are different, extra spaces may be added between rows of cells in one direction.

Embodiments of the present invention will now be more particularly described by way of example and with reference to the accompanying drawings, in which:

FIG. 1 indicates schematically the principle of circuit hierarchy;

FIG. 2 illustrates schematically the principle of routing geometries connecting the pins of circuit blocks;

FIG. 9 illustrates the width and spacing of the circuit interconnect shapes;

Figure 12:
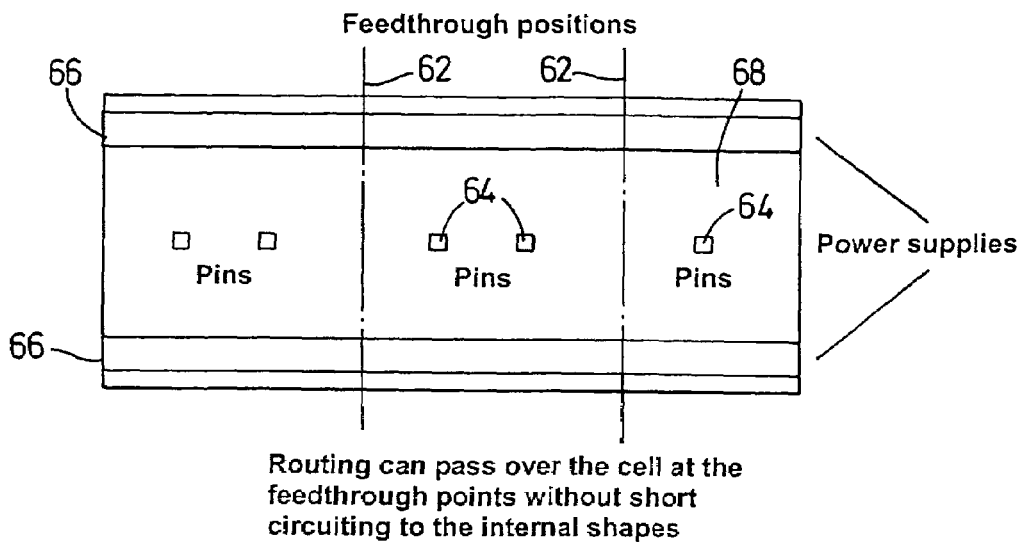
Figure 13:
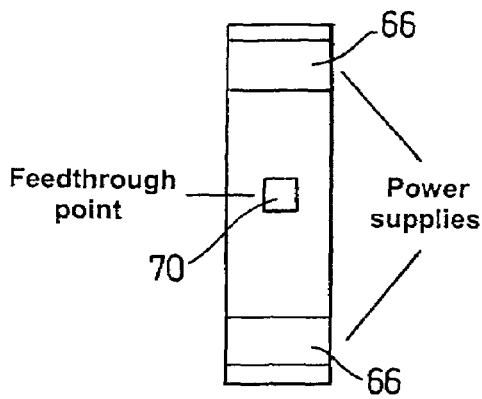
Figure 16:
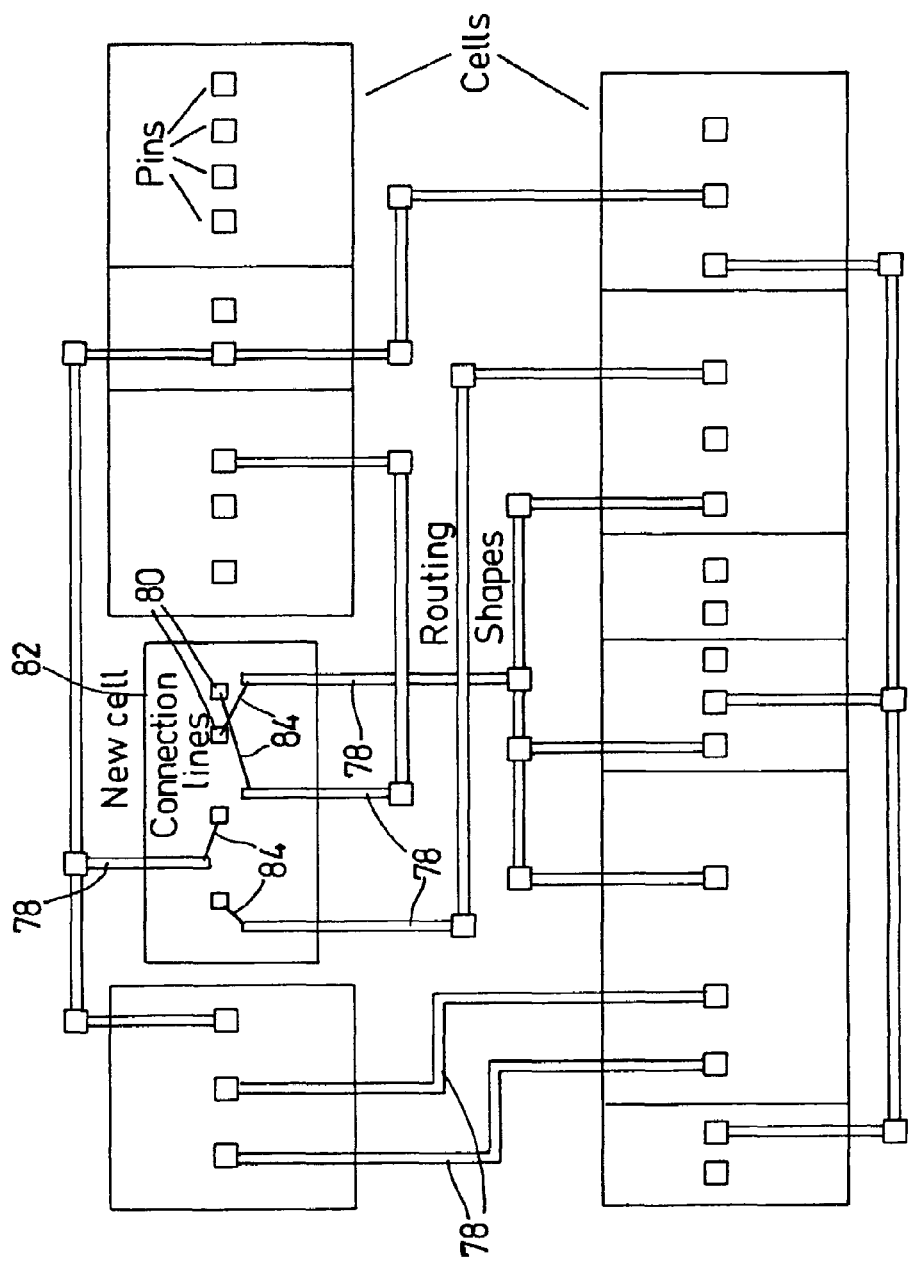
Figure 24:
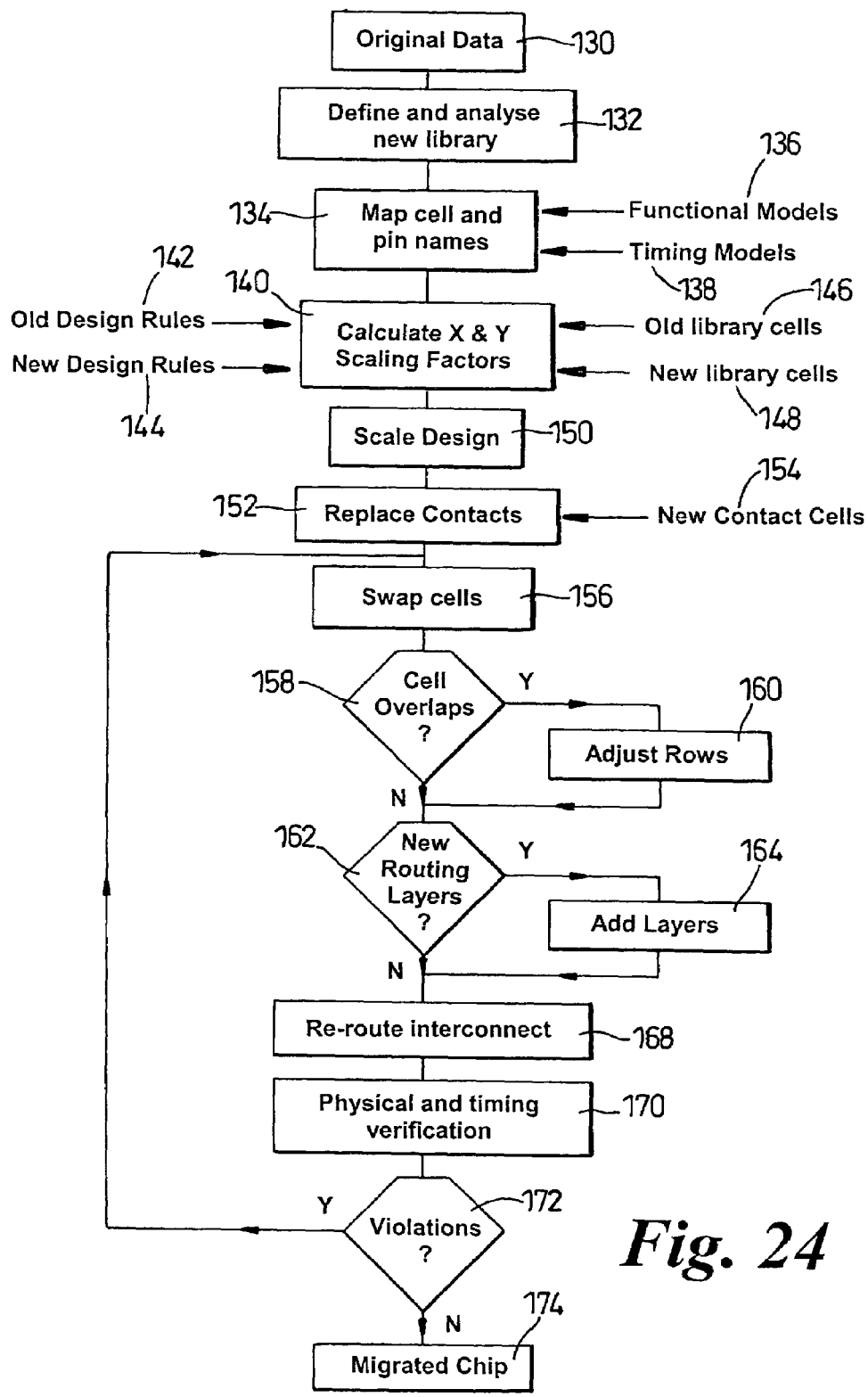

FIG. 10 shows contact and via shapes;
FIG. 11 illustrates replacing via cells in the layout;
FIG. 12 illustrates feedthrough points in a typical standard cell;
FIG. 13 shows a typical feedthrough cell;
FIGS. 14a and 14b illustrate swapping cells in a layout;
FIG. 15 illustrates swapping a cell and adjusting its position;
FIG. 16 shows rat's nest connections for a swap cell;
FIG. 17 illustrates many-to-one cell swapping;
FIGS. 18a, 18b and 18c illustrate new cells being moved aside to remove overlaps;
FIGS. 19a and 19b illustrate moving cells to the row above or below to give extra space to a constrained row;
FIGS. 20a and 20b illustrate the principle of rerouting connections on a swapped macro cell;
FIGS. 21a, 21b and 21c illustrate swapping equivalent pins on a three input and gate;
FIGS. 22a and 22b illustrate routing promoted to a higher layer;
FIGS. 23a and 23b show compaction of geometries and cells, and
FIG. 24 illustrates in a flow diagram the steps of the process for modifying an integrated circuit.

A typical circuit hierarchy is shown in FIG. 1. Building blocks 2 of a circuit are placed into larger blocks 4, which are placed into yet larger blocks 6.

The technique for modifying the circuit involves mapping a library of new cells against the cells already in place for the old circuit. The new cells will have the same logical function as the old but may contain different topologies and combinations of components to achieve these functions. The cell swapping systems treats these cells as "black boxes" and is not concerned with the detail of their construction beyond the outline of the cell and the pins defining the input and output terminals for the cell.

The modification sequence will include some or all of the following processes, which are described in more detail subsequently:

Translation and selection of the new library of circuit components
Functional and timing analysis of old and new components
Mapping of the names of new cells to old cells
Mapping each instantiation of a cell based on its optimum functional and timing replacement
Mapping of the names of connection points on new cells to connection points on old cells
Mapping the names of the interconnect layers
Design analysis and scaling calculations
Standard cell "porosity" calculations
General scaling of the data in the X and Y directions
Contact replacement
Cell swapping
Cell row adjustment
Insertion of extra "feedthrough" cells in a standard cell design
Addition of extra routing layers
Re-routing of interconnect shapes
Compaction
Verification
Timing verification
Delivery First, a new design library must be obtained which contains components with similar functionality to the old cells and which match the new manufacturing process. New cells contained in the libraries must be available to the cell swapping system. These libraries will include the physical shapes making up the component, descriptions used for manufacturing ("the layout") and the functional electrical description of each component, the logical description for the component and the delay information from the input to the output of each pin of the component (the "timing information").

An analysis of the function and timing of the old and new components is then cared out. Each component contained in the old library is compared to the components in the new library to determine the best match available. Replacement cells can be defined globally for the entire design or they may be selected on an instance by instance basis.

First, the matching process will examine the logical function of the component and compare the boolean truth table for the component with those available in the new library.

For example, the existing library may contain a cell called AN210, a function boolean AND gate, with input pins named "A" and "B", and an output pin "Y", which has the boolean truth table of:

| A | B | Y |
|---|---|---|
| 0 | 0 | 0 |
| 0 | 1 | 0 |
| 1 | 0 | 0 |
| 1 | 1 | 1 |

The target library may contain details of a cell called AND2, a function boolean AND gate, with input pins named "C" and "D", and an output pin "X", which has the boolean truth table of:

| C | D | X |
|---|---|---|
| 0 | 0 | 0 |
| 0 | 1 | 0 |
| 1 | 0 | 0 |
| 1 | 1 | 1 |

The truth tables for the old and new cells match so it is determined that "AND2" in the new library is a candidate to replace "AN210" in the circuit to be modified. This process will locate all components in the new library that are logical equivalents of the original cell.

The mapping process also examines the functionality of each pin and returns the list of pins that match in the old and new cells. For example, the pins may be matched as follows:

| AN210 | | AND2 |
|---|---|---|
| Pin A | -> | Pin C |
| Pin B | -> | Pin D |
| Pin Y | -> | Pin X |

This also shows that certain pins may be swapped without affecting the logical functionality of the circuit. This may be beneficial in modifying the interconnect shapes between the circuit's components.

| AN210 | | AND2 |
|---|---|---|
| Pin A | -> | Pin C or Pin D |
| Pin B | -> | Pin D or Pin C |
| Pin Y | -> | Pin X |

In this example, pins C and D may be swapped but Pin X may not.

In addition to logical functionality, the signal propagation delays from the inputs to the outputs of a cell may be examined to determine the ideal replacement components. These delays are usually available for each cell and defined in units of time (i.e. fractions of a second).

Each cell that matches logically has its timing information analysed and the cells are placed in order with the best timing match at the top and the worst at the bottom.

Circuit simulators can use this information to determine whether the replacement cells will function correctly and at an appropriate speed.

Other information can also be checked when selecting a replacement cell. Electrical parameters such as signal "fan out" (the number of components driven by another) or physical parameters such as the sizes of each cell may be taken into account to determine which replacement cell can be used.

In addition to simple single cell replacements, existing cells can be replaced by a number of target cells (one-to-many replacement) and/or a number of connected existing cells with a netlist for the specific design being passed, can be replaced by a single target cell (many-to-one replacement).

For example, the existing library has a cell with the boolean 'AND' function with the logic table:

| A | B | Y |
|---|---|---|
| 0 | 0 | 0 |
| 0 | 1 | 0 |
| 1 | 0 | 0 |
| 1 | 1 | 1 |

This can be replaced by a cell with the boolean 'nand' function followed by an 'inverter' cell which have the logic tables:

| A | B | Y |
|---|---|---|
| 0 | 0 | 1 |
| 0 | 1 | 1 |
| 1 | 0 | 1 |
| 1 | 1 | 0 | followed by

| A | Y |
|---|---|
| 0 | 1 |
| 1 | 0 |

Combining these two cells gives the same logical functionality as the single cell in the original circuit.

It is also possible to apply the same principle in reverse and replace the 'nand' and 'inverter' cells with a single 'and' cell. Timing comparisons between existing/replacement single cells and existing/replacement multiple cells can be made to locate the best timing match. This process of multiple cell processing can also apply to sequential as well as combination cells.

The names of the old cells and the new cells must be mapped. Once the replacement for each of the logical cells is defined, the name mapping information is made available to the process migration system for use in the subsequent phases of the circuit's modification.

The names of connection points on old cells and new cells also need to be mapped. As illustrated in FIG. 2, each circuit component in an integrated circuit contains a series of devices or cells $10a$–$10k$ that are connected to perform a defined function. In order to connect this group of devices to one another, each cell will have a series of geometries or pins 12 that serve as connection terminals and are used as access points by the rest of the circuit. An integrated circuit layout uses sequences of "routing" geometries 14 to connect these components in a combination that defines the function of the larger circuit. FIG. 2 shows these routing geometries connecting the pins of circuit blocks.

Figures 3, 4:
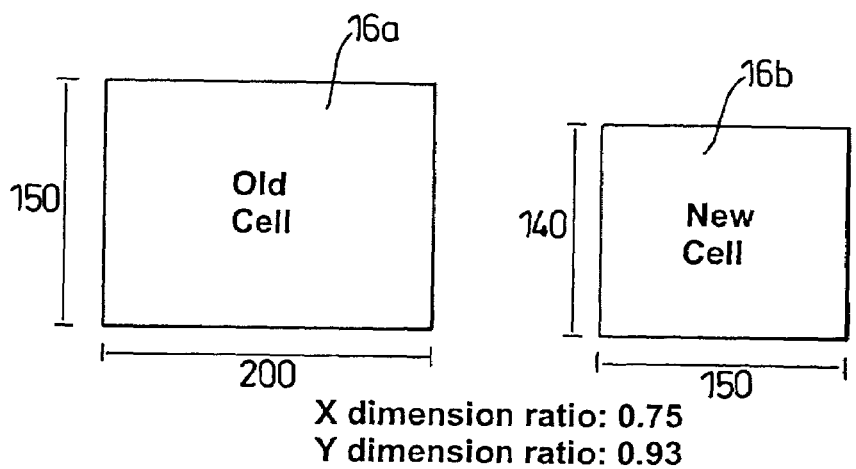
FIG. 3 is a mapping table of cells and pins.
FIG. 4 illustrates the ratio of old to new cell dimensions.

The names of these pins are arbitrary and are likely to be different in the cells defined in the old and new libraries. The system must be made aware of the mapping between pin names in the old and new cells. The pin names maps are defined during functional and timing analysis. An example of a mapping table of cells and pins is shown in FIG. 3.

Each instantiation of a cell may also be examined by the system to check that its replacement gives optimum performance when used. The Electrical configuration of a particular component, such as the physical distance from its output to the next components input, may dictate that a different replacement is used in that particular instance.

The names of the interconnect layers must also be mapped, since the names of the layers defining the circuit may differ between the old and new libraries. For example, the first layer of interconnect in the old circuit may be called "metal 1" and the new technology may define it as "met1". The system can process the circuit before, during and after the migration process to update the layer names to the new technology to give compatibility with the new manufacturing rules and naming conventions.

This technique makes it possible for layout data from different manufacturers to be combined on a single chip enabling "system on chip" construction from separate circuit components, often described as "hard intellectual property".

A series of design and analysis calculations may then be carried out. In many cases, the migration of a chip from an old manufacturing process to a new one is performed to take advantage of smaller geometries which give better performance and lower manufacturing costs per unit. This means that the sizes of the cells being placed into the modified circuit differ from those of the original cells. In order to accommodate the difference in cell sizes the complete chip is scaled by a factor that is defined by the ratio of the sizes of the old cells to the sizes of the new cells. This is illustrated in FIG. 4, in which an old cell 16a having dimensions of 150×200 units is replaced by a new cell 16b having dimensions of 140×150 units. The X-dimension is in this case scaled by a ratio of 0.75 and the Y-dimension is scaled by a ratio of 0.93. However, the overall layout of the chip may be divided and different scale factors may be applied to different sections.

Each cell in the layout will be of a defined size and will be replaced by a new cell of another defined size. This makes it possible to work out the ratio of the old cell to the new cell and use this in a scaling calculation. This must be repeated for each cell type that must be swapped and a listing of ratios derived.

Once this information has been calculated, it can be used to analyse the placement of those cells in the complete circuit and, therefore, the total area required to accommodate the new cells in the layout.

Figure 5:
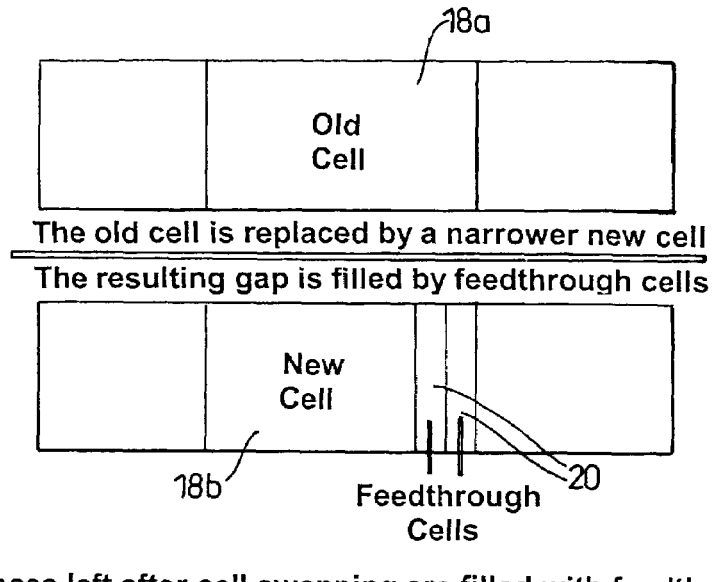
FIG. 5 shows spaces left after swapping cells filled with feedthrough cells.

By shrinking the entire design by a factor defined by the size ratio of the old cells to the new, the nest cells will fit into the gaps vacated by the old. However, in many cases, the ratios of each old cell to each new cell may not be consistent across the entire library thus giving a different scaling factor for different cells. If this is the case, the optimum derived scaling factor may be used to ensure that all of the new cells will fit in the migrated design. This may leave small gaps when cells with a smaller scaling ratio are introduced to the circuits, but these gaps will not affect the overall functionality of the circuit and extra routing shapes will be used to maintain the integrity of the circuit's connections. They may also be filled with "feedthrough" cells that fill the spaces in the new design and maintain the integrity of circuit shapes in the cell rows. These spaces left after swapping cells and filled with feedthrough cells are illustrated in FIG. 5, the old cell 18a having been replaced with a narrower new cell 18b and the resulting gap having been filled with feedthrough cells 20.

The differences in aspect ratios between the cells must also be taken into account when calculating a scaling factor. It is likely that the ratio of the X dimensions of the two cells will differ from the ratio in the Y dimensions. Scaling factors for the X and Y directions can be calculated and defined separately.

It is possible that some components of a cell such as resistors or capacitors may affect the size of the new cell and this too may be factored into the scaling calculations.

In the case of a "macro" (non-standard) cell or block or circuitry, the larger of the two dimensions may be taken as the scaling factor or an offset scale factor in the X and Y axes may be applied to compensate for the differences in the aspect ratios of the new cells.

Figure 6A:
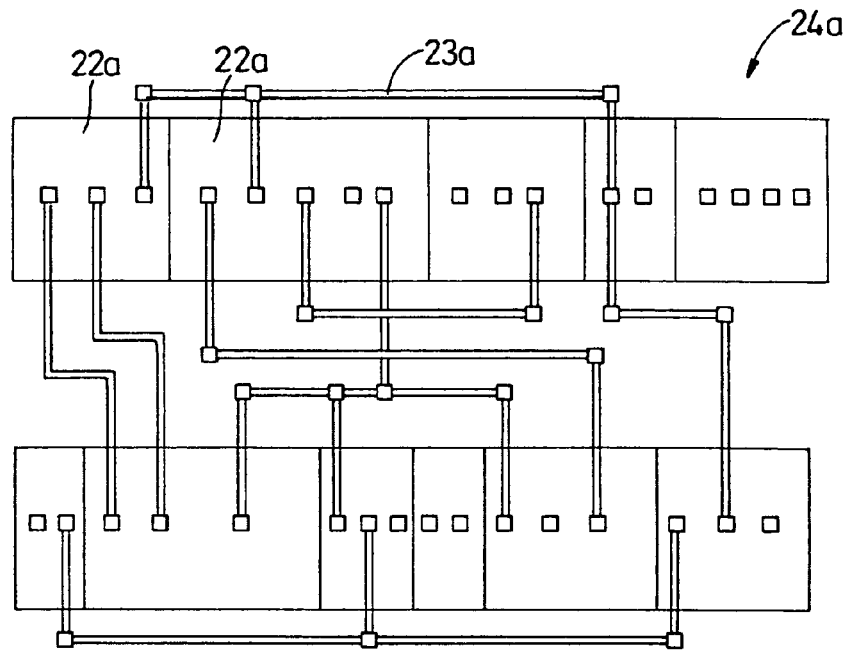
FIGS. 6a and 6b illustrate scaling data across the x axis of cells and routing in a standard cell design.
Figure 6B:
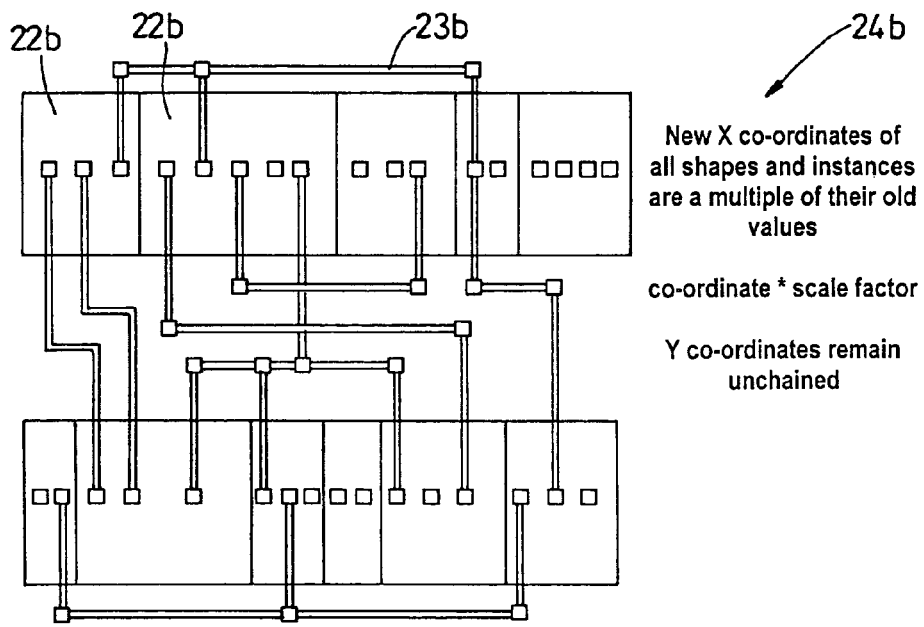

In a design consisting of standard cells, it is possible to apply different scaling factors in the X and Y axes to give the optimum size for the circuit at the end of the process as the nature of the data in such a design is different in each plane. For example, when cells are placed horizontally in the X axis, the position of the cells and the shapes connecting them are set by the width of the standard cells and these dimensions will be consistent for the entire layout. This enables a scaling calculation in this direction to be used for the entire layout FIGS. 6a and 6b illustrate scaling data across the X axis of the cells and routing in a standard cell design, wherein the cells 22a and interconnect shapes 23a in the old circuit 24a, shown in FIG. 6a, have been replaced by new cells 22b and interconnects 23b in the new circuit 24b, shown in FIG. 6b, the X dimensions of which have been multiplied by the same scaling factor. The new X co-ordinates of those shapes and components are therefore equal to the old co-ordinates multiplied by a scaling factor, whereas the Y co-ordinates are unchanged.

Figure 7:
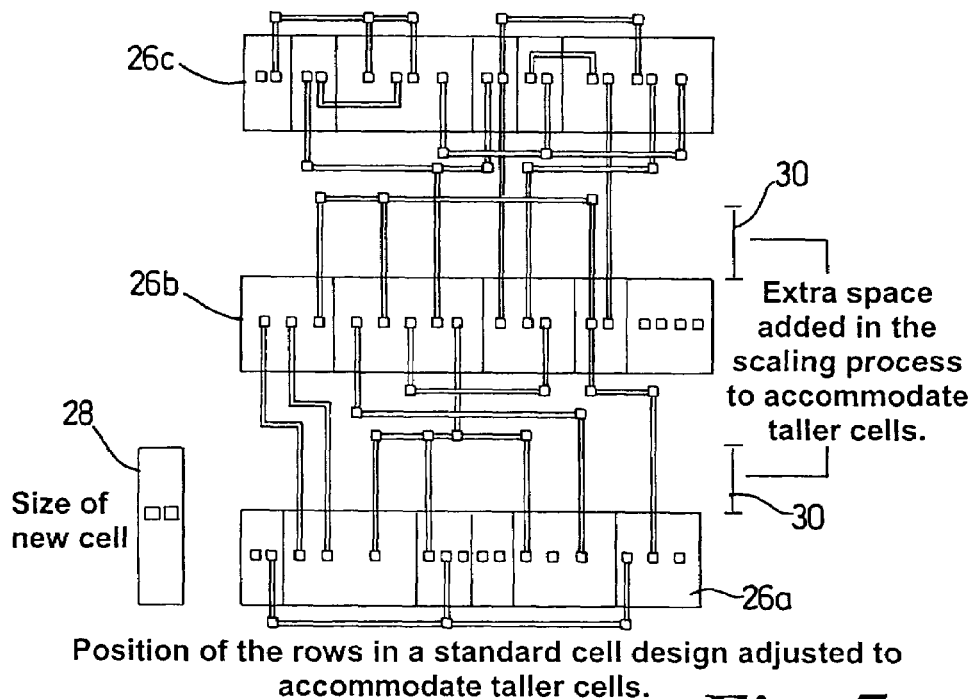
FIG. 7 shows the position of each row of a standard cell design including expansion in the y axis.

FIG. 7 shows how the positions of the rows 26a, 26b and 26c of circuit components in a standard cell design may be adjusted to accommodate taller cells 28. Extra space 30 is added between the rows 26a–26c during the scaling process to allow those taller cells to be inserted. It will be appreciated that the scaling calculation in the Y axis is necessarily more complex as the calculations must account for a change in the position of each row of cells and the routing between them if the ratio of the heights of the old and new cells differs from that of the widths. An additional amount must be added to each row of the design to accommodate the extra space needed to accommodate the height of the new cell.

This may be expressed as:

New co-ordinate=(old co-ordinate*scale)+(height factor*row number)

where the scale is determined by the general scaling calculations; where the height factor is defined by the difference in heights between the old and new cells; and where the row number is counted as the position of a row from the bottom of the layout.

A general scaling process is then carried out. Once the scaling factor has been determined, it is applied to each cell and geometry in the whole chip. Each co-ordinate is multiplied by the scaling factor to modify the size of the chip while keeping the geometries and hierarchy of the chip intact. At this stage, the new chip will be identical to the old in everything but scale, and extra spaces may be added between rows of standard cells.

The scaling geometries and cells may be defined as:

Co-ordinate*scaling factor

Figure 8A:
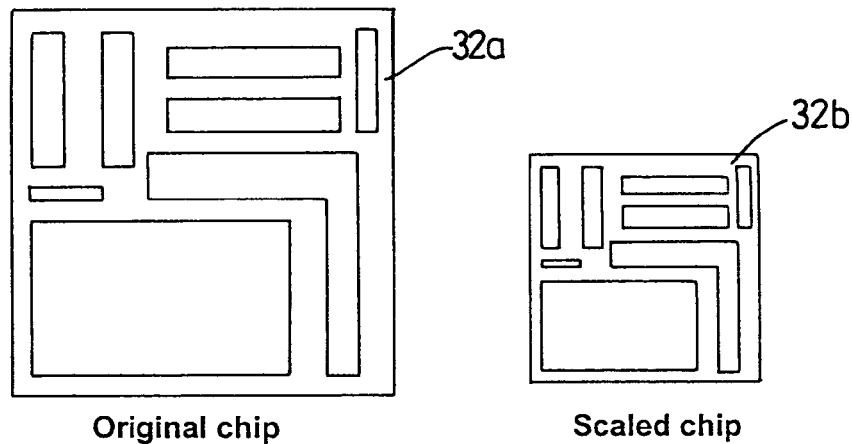
FIGS. 8a and 8b illustrate examples of scaled shapes and scaled cells.
Figure 8B:
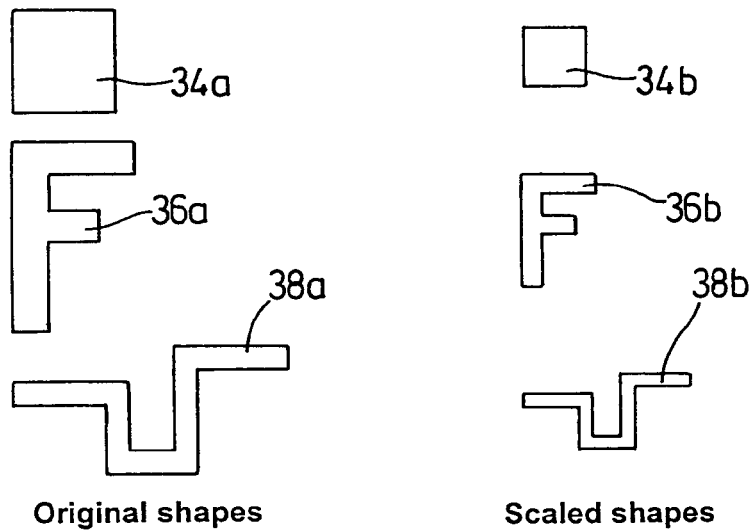

In the general scaling process, each shape within the layout will be adjusted relative to the origin of the chip's axes i.e. $x=0$ $y=0$ Examples of scaled cells and shapes are illustrated in FIGS. 8a and 8b. FIG. 8a shows an original clip 32a and a scaled chip 32b that is identical in layout to the original chip but reduced in scale, the new dimensions being equal to the old dimensions multiplied by the scaling factor. FIG. 8b shows a variety of original shapes 34a, 36a, 36b and the equivalent scaled new shapes 34b, 36b, 38b for which the new dimensions are again equal to the old dimensions multiplied by the scaling factor.

Next, the widths of the interconnects are resized to the widths specified by the new manufacturing process. As is shown in FIG. 9, the width 40 and spacing 42 of circuit interconnect shapes 44, i.e. the shapes connecting the circuit together ("interconnect" or "routing" shapes) are defined by the manufacturing process and must be adhered to when designing the physical layout of the circuit. These values are usually defined as a minimum that must be met or exceeded in the design process.

In order to meet the constraints of the new design rules, these interconnect shapes are resized to values defined by the new manufacturing process. These shapes may be defined as paths which are centre line figures with a defined width or as polygons which are defined by the co-ordinates of their boundaries. They are sized to meet the new design rules and some will be adjusted to other rules such as those for power supplies.

The scaled components are also adapted to the design grid. Integrated circuits are designed to have the co-ordinates of each shape as a multiple of a pre-defined grid. The scaling factor must take the new design grid into account and this can be accomplished in two ways: either by calculating the scaling factor to ensure that the co-ordinates of all shapes in the scaled layout fall on the grid or by snapping the co-ordinates to the grid as they are scaled. All co-ordinates in the final chip must be placed on the defined design grid.

The next step of the process comprises replacing the via cells. The interconnect shapes are defined on various layers in the manufacturing process and these layers are separated by a layer of insulating material called a dielectric to prevent them shorting. Holes in the dielectric allow the layers to connect to form connections within the circuit and these holes, known as "contact" and "via" shapes, have a size defined by the manufacturing process rules. Each of these shapes must be overlapped by the layers they connect by a fixed amount and they are usually placed as instantiated cells that contain the geometries needed to connect the routing shapes. FIG. 10 shows examples of contact and via shapes, the via geometry 50 between two layers comprising a first layer 52, a via 54 and a second layer 56. A 3×2 array 58 if via geometries is also shown.

The migration system replaces each of these cells with another that is designed to match the rules in the new manufacturing process. If the contact and via cells are not defined as instances, the shapes that make them up can be identified and replaced with instances of the new via cell or the existing shapes making up the via adjusted.

As shown in FIG. 11, which illustrates the replacement of via cells in the layout, when swapping the via shapes, the system ensures that the interconnect geometries overlap the new via correctly to maintain circuit connectivity. Thus, the old via cell 60a is replaced by a new via cell 60b and a via 60c made up of polygons is replaced by a new via cell 60d.

A set of standard cell porosity calculations are then carried out. Standard cells are common building blocks in electronic circuits that are used in combination to produce a larger and more complex device. These cells conform to regular dimensions that allow them to be placed in an integrated circuit layout in a regular fashion to make the best use of area and give known values of circuit functional performance.

These standard cells are placed in rows and connected by combinations of shapes that form the wiring of the circuit and connect the circuit to the other circuits or the outside world. In order to connect between rows, the cells are designed to have gaps within them that allow the routing geometrics to pass through without short circuiting to the internal circuitry. These gaps are known as feedthrough areas and they are a feature of a standard cell library. Feedthrough points are particularly important in circuits containing two routing layers as the feedthrough points are the only way making circuit connections cross cell rows.

FIG. 12 shows feedthrough points 62 in a typical standard cell. The feedthrough positions are located between the pins 64 and the power supply elements 66 of the standard cell 68. The number of feedthrough points in a standard cell is referred to as its porosity and the number of these points must be comparable between the cells of the old and new libraries. If they are not the routing of the layout will not be able to cross the rows of cells and this will result in short circuits. By analysing the number of feedthrough positions in the old and new cells, the relative porosity of each cell can be calculated and extra feedthrough points added to ensure routing shapes can cross cells safely.

A typical feethrough cell is shown in FIG. 13, the feedthrough point 70 being located between the power supply elements 66. A re-routing program can be applied to the routing shapes in a layout to resolve problems of feedthrough points that are in different positions in new cells compared to the old but the number of these points may be important in the re-routing process.

All feedthrough points on a layer are equivalent along each row of standard cells. Wires may treat any feedthrough points as valid points to cross a row of cells.

The next step of the process comprises replacing the cells. The cell swapping migration system takes each cell in the existing layout and swaps it for a new cell defined by the user. The old cell will be removed from the layout and the new cell placed in the layout with the same co-ordinates, orientation and magnification. Once it is in place, the routine shapes can be connected to the new cell's pins or wires can be added to retain the connectivity information for use later in the cell swapping and re-routing program.

Referring to FIG. 14a, which illustrates the process for swapping cells in a layout, the position of the new cell 72b will match that of the old cell 72a and it may be offset or adjusted to ensure that it fits in the gap vacated by the old cell. The routing to the connections A and B is updated to the new positions of those connections. Similarly, as shown in FIG. 14b, and old cell 74a can be replaced by a new cell 74b and the routing to the connections A and B of the cell can be updated for each cell modified. The data can be updated for individual cells, by cell type or for all cells. Examples of this adjustment include moving the cell to compensate for different positions of the data within the cell or rotating or mirroring the cell to put the connection points in a better position. An example of swapping a cell and adjusting its position is illustrated in FIG. 15, wherein the shapes and boundary of a cell are offset from the original position 76a defined in relation to a co-ordinate (0,0) to a new position 76b. The swapped cell is moved by altering its co-ordinates such that:

co-ordinate $X$=co-ordinate $X$+delta (cell1$X$ cell2$X$), and co-ordinate $Y$=co-ordinate $Y$+delta (cell1$Y$ cell2$Y$)

where 'delta'=the distance between the two points.

As the new cell is placed, the system examines the connection points within the cells and maps the shapes that are connected to that cell to their new positions. The full adjustment may be done during placement or the relevant information for that adjustment may be stored in the database for adjustment later. One method of storing this information is to place a wire that links the routing shapes between the old connection point and the new connection point, forming a "rat's nest" connection that can be examined by a re-routing program later in the migration process. An example of the rat's nest connections for a swapped cell is shown in FIG. 16, wherein the connection between the routing shapes 78 and the connection pins 80 for a newly swapped cell 82, have been maintained by the addition of rat's nest connections 84. Another method could involve storing the cells' connection information as a property of the new cell or it could be stored in a look up table.

The relative positions for the connection points in the old and new cells need not be the same, as the re-routing procedures will compensate for differences between the connection points.

In some cases, the old cell may need to be replaced with more than one new cell as described in the 'functional and timing analysis' section above. In this case, the old cell will be replaced by a composite group of new cells providing the sane logical functionality. Extra information will be required to describe the electrical connections within this group of cells and the connection points of the cells will be linked with "rat's nest" shapes that will be fed to the re-routing system described below.

The functional analysis of the circuit may also generate instances where multiple components may be replaced with one cell. In this case, the group of cells is swapped for the new component and the wires connecting the old cells are adjusted to reflect the new conductivity of the replacement. FIG. 17 illustrates an example of many-to-one cell swapping, in which a NAND gate 85 and an inverter 86 in the old circuit are replaced with a single AND gate 87, giving the identical logical function. The single component therefore replaces the original gates and the routine shapes are updated accordingly. The reverse of this process giving a 'one to many' equivalent may also be performed.

A cell row adjustment process may be required. When the cells have been swapped, it is possible that some of the new cells will overlap their neighbours causing short circuits. This may be remedied by using a "shuffling" technique to slide the cells in each row from side to side, pushing the cells apart so they fill in gaps in the cell rows and no longer overlap. FIGS. 18a, 18b and 18c illustrate new cells moved aside into gaps in the row to remove overlaps. In FIG. 18a, three NAND gates 88a, 88b and 88c in the old circuit each have a width of 10 µm and abut one another correctly. In the new circuit these are replaced by new cells 89a, 89b, 89c each having a width of 12 µm. If these are placed in the same positions as the old cells they will overlap as shown in FIG. 18b, producing short circuits. The first and third instances are therefore moved aside as shown in FIG. 18c to provide the extra space needed to accommodate the new cells.

It is beneficial to make the smallest adjustments necessary to remove the overlaps in the cell rows to minimise the extra routing shapes needed to maintain the connectivity of the circuit. This is achieved by finding the closest gap to the left or right of each of the overlapping cells and adjusting the fewest number of cells possible. It may also be possible to move some cells from a fully occupied row to a less dense row above or below to give the extra space required. FIGS. 19a and 19b illustrate moving cells to the row above or below to give extra space to a constrained row. The circuit includes first and second rows of cells 90, 91. After swapping as shown in FIG. 19a, cells 92, 93, 94 and 95 in the second row 91 overlap, causing short circuits. One those cells 93 (Inst 15) is therefore moved into the first row 90 as shown in FIG. 19b to ease congestion in the second row 91 and the adjacent cells 92, 94 (Inst. 14 & 16) are then moved together.

In some cases, it may be necessary to increase the width of a row to accommodate the extra area of the new cells and this is addressed through the general scaling calculations and the data scaling operation.

Extra feedthrough cells may then be inserted if required. In standard cell designs, the ratio of old cells and new cells may be different for various components in the libraries and this must be accommodated in the cell swapping process. If some of the new cells are narrower than the cells they are replacing, the system can use feedthrough cells to fill the gaps left by using the narrow cells and keep connections in the power rails and wells that run along the rows of the cells. Alternatively, top level connection shapes may be placed to maintain circuit connectivity. The extra feedthrough cells may be placed on either or both sides of the new cell.

The circuit interconnect is next re-routed. Once some or all of the cells have been swapped, the migration system adjusts the shapes of the circuit's interconnects to establish the correct connectivity between the cells. The re-routing programs examine each of the cells in turn and adjust the routing shapes that are connected to it in sequence until all of the connections have been made. An editing system such as a layout editor may be used to adjust the data within the layout to add or change the routing so as to add new features or functionality. This rerouting of the connections of a macro cell and standard cell is illustrated in FIGS. 20a and 20b. The newly swapped cell 100 shown in FIG. 20a includes rat's nest connections 102 that show the new routing required to connect to that cell. The pins 104 of the new cell are routed to the circuit's existing interconnect shapes 106 with extra layers 108 and vias 110 added where necessary, as shown in FIG. 20b.

When re-routing the interconnect to the pin positions of the new cells, the migration system may either use the information the migration system stored within the database when swapping the cells or examine each cell and its pins on an instance by instance basis. The re-routing programs take each section of interconnect geometry and adjust its co-ordinates and may add extra shapes to establish a connection between those geometries and the appropriate pin within the new cell. In doing so, the system checks neighbouring geometries including those in the sub-cells of the design to ensure that a short-circuit does not occur and it will make further adjustments to the routing geometries to prevent any such potential short-circuits from being introduced.

The re-routing system may also introduce new geometries on other layers to solve problems when re-routing the connections to particular cells and it may add, move or delete via cells at any time.

In some cells, there may be pins connected to other parts of the circuit that are logically equivalent to each other. Examples of these equivalent pins include the input to cells with core logical functions such as "nand" or "nor" gates. When re-routing these pins, the system has the flexibility to swap the connections to groups of logically equivalent pins to reduce congestion and give a better overall routing result. The definition of these pins would be controlled by the user of the system or defined in the cell and pin naming tables. FIGS. 21a, 21b and 21c illustrate this swapping of equivalent pins on a three input nand gate. As shown in the circuit diagram of FIG. 21a the nand gate 112 includes three input pins IN1, IN2 and IN3 that have identical logical functions, and an output pin OUT. In the swapped cell shown in FIG. 21b, the connections to the pins IN1 and IN3 cross over each other. This can be corrected as shown in FIG. 21c by swapping the connections to those pins. This makes re-routing easier while retaining the circuit's logical functions.

The process may include the addition of extra routing layers. Advances in manufacturing processes have enabled extra routing layers to be added to a chip giving advantages of greater density in the final layout. When re-routing an older chip, it is possible to take advantage of these layers by moving some of the existing interconnect data to new routing layers so that it may overlap on the circuit's cells or other routing shapes. This may be achieved by promoting all of the data on one layer up to a higher layer or by making extra routing layers available to the re-routing algorithms that complete the connections to the newly swapped cells. In some cases, it may be possible to use fewer routing layers in the migrated design and the circuit's interconnect may be modified to use as few routing layers as possible.

An example is shown in FIGS. 22a and 22b where routing is promoted to a higher layer. In the original layout shown in FIG. 22a routing 114 on the metal 1 layer is connected to routing 116 on the metal 2 layer through metal 1–metal 2 vias 118. This is rearranged as shown in FIG. 22b by promoting the routing information on the metal 1 layer to the metal 3 layer and connecting the routing 116 on the metal 2 layer to the new routing 120 on the metal 3 layer through metal 2–metal 3 vias 122.

A compaction process may then be applied. Once the cells have been swapped, and the re-routing process completed, it is possible to apply a compaction program to the circuit to push the components together and remove any gaps between them. There are a variety of commercial and public compaction algorithms available for this and the techniques they employ are beyond the scope of this patent application. Their application on the circuit after cell swapping may be useful for removing extra space in the final layout. An example in FIGS. 23a and 23b shows compaction of geometries and cells in the X and Y directions. FIG. 23a shows the layout before compaction, with extra space between the cells 124. FIG. 23b shows the layout after compaction. The extra space between the cells 124 has been removed and the routing geometries 126 have been adjusted accordingly.

A verification process is then applied. Once the entire circuit or a portion of the circuit is migrated, it is verified using industry standard design tools. These will include a design rule checking (DRC) system and layout-versus-schematic system (LVS). These will ensure that the newly migrated chip conforms to the new design rules and has retained the integrity of the connections within the circuit A timing verification process may then be applied. As integrated circuits become smaller and faster, the performance of the devices may become limited by the delays inherent in the connections between components rather than delays in switching transistors. In order to address this problem systems have been developed that analyse and highlight problems in circuit timing.

Timing problems may be fixed by making certain modifications in the circuit to improve signal integrity, particularly in clock signals. The system can implement these changes by swapping components that do not meet requirements for those that do. An example of this would be a buffer that does not have sufficient output strength to drive the signals to which it connects. This could be swapped for a more powerful buffer using the system described above. The problem cell would be identified, swapped for a new cell and the neighbouring cells moved to provide any extra space required. Once this was done, the routing would be modified to connect the new component and the circuit verified as above.

The system gives the ability to swap individual cells at any part of the circuit after problems are identified through timing simulation and to fix these problems accordingly.

The finished circuit is finally delivered to the manufacturer. When the layout migration is completed and the new chip has passed verification, it may be delivered in an industry standard format such as GDSII or CIF.

The steps of the process for modifying an integrated circuit are illustrated in FIG. 24. In the first step 130 the original data relating to the old circuit is gathered and analysed. Next, a new library is defined and analysed 132, and replacement cells are selected for the cells of the old circuit. The cell and pin names are then mapped 134, and the functionality and timing of the cells are examined using functionality models 136 and timing models 138.

Next, the X and Y scaling factors are calculated 140, taking into account the old design rules 142 and the new design rules 144, and using the old and new libraries of cells 146, 148. The cells and interconnects are then scaled 150 according to the determined general scaling factor and the contacts are replaced 152, with new contact, feedthrough and via cells being added if required 154.

The cells are then swapped 156, each cell of the old circuit being replaced with a new cell having the same function.

The circuit is then examined for cell overlaps 158. If any overlaps are found, the rows are adjusted 160 to remove those overlaps. An assessment is also made as to whether any new routing layers are required 162 and, if so, those layers are added 164. The interconnect is then re-routed 168.

A verification process is then applied 170, in which the circuit is examined for compliance with physical and timing design rules for the new technology. If any violations of those rules are detected 172, the offending cells are swapped 156 and the subsequent steps 158 to 172 are repeated until the circuit complies with the design rules, resulting in the final migrated chip 174.

The invention claimed is:

1. A process for modifying the design of an old integrated circuit that is suitable for manufacture at a first geometric size by a first manufacturing method to produce a new circuit that is suitable for manufacture at a second geometric size by a second manufacturing method while maintaining the functionality of the old circuit, wherein the first and second manufacturing processes are different and the geometry sizes are-different, said process including the steps of:
   a) comparing old gates stored in an electronic data model of the old integrated circuit against a target supplier library for supplying new gates suitable for the second manufacturing process, said supplier library being different from the electronic data model of the old integrated circuit and the new gates stored in the supplier library having been generated in accordance with the design rules of the second manufacturing process, said electronic data model including logical function, timing and geometric size information of the old gates and the supplier library containing logical function, timing and geometric size information for the new gates;
   b) analyzing the logical functions of the old and new gates using Boolean truth tables to determine a set of logical equivalent new gates for at least some of the old gates in the old integrated circuit;
   c) for each old gate having at least one logical equivalent new gate in the supplier library, analyzing the timings of the old gate and each logical equivalent new gate in the set using signal propagation delay information by comparing the signal propagation delay across each individual gate from a gate's input to a gate's output;
   d) for each old gate having at least one logical equivalent new gate in the supplier library, selecting a single logical equivalent new gate from the set of logical equivalents to replace the old gate on the basis of the timing analysis;
   e) scaling the old integrated circuit to the second geometric size;
   f) producing a data model of the new circuit by substituting at least some of the old gates in the old circuit with their logical equivalent new gates selected from the supplier library while maintaining the electrical connections between the gates; and
   g) subsequently adjusting the routing geometry of the electrical connections between the gates.

2. A process according to claim 1, wherein for each old gate that does not have a logical equivalent new gate in the supplier library of new gates, matching the logical function of the old gate to the logical function of a plurality of new gates.

3. A process according to claim 1, wherein for each old gate that does not have a logical equivalent new gate in the supplier library of new gates, matching the logical function of a plurality of old gates to the logical function of one new gate.

4. A process according to claim 1, wherein the library contains information about each of the new gates, including at least one of: a description used for manufacturing and a functional electrical description.

5. A process according to claim 1, including scaling the circuit by a general scaling factor.

6. A process according to claim 5, including comparing the relative sizes of the old gates and the new gates and selecting the general scaling factor on the basis of that comparison.

7. A process according to claim 6, wherein the scaling factor is determined by the ratio of the height of the old and new standard gates.

8. A process according to claim 6, wherein the scaling factor is determined by the ratio of the average widths of the old and new standard gates.

9. A process according to claim 11, including applying different scaling factors in the directions of two orthogonal axes.

10. A process according to claim 5, including adding feedthrough cells to fill gaps left after scaling the circuit.

11. A process according to claim 1, including scaling portions of the circuit by different scaling factors.

12. A process according to claim 1, including replacing the via cells.

13. A process according to claim 1, including adding feedthrough points.

14. A process according to claim 1, including adjusting the positions of the electrical gates.

15. A process according to claim 1, including adding or removing routing layers.

16. A process according to claim 1, including re-routing interconnect shapes to meet the connection points of new circuit gates.

17. A process according to claim 1, including moving electrical connections from one routing layer to another.

18. A process according to claim 1, including compacting the circuit.

19. A process according to claim 1, including verifying the circuit.

* * * * *